US007829258B2

(12) United States Patent
Ukpabi

(10) Patent No.: US 7,829,258 B2
(45) Date of Patent: Nov. 9, 2010

(54) LASER COLORATION OF COATED SUBSTRATES

(75) Inventor: Pauline O. Ukpabi, Oshkosh, WI (US)

(73) Assignee: Appleton Papers Inc., Appleton, WI (US)

( * ) Notice: Subject to any disclaimer, the term of this patent is extended or adjusted under 35 U.S.C. 154(b) by 192 days.

(21) Appl. No.: 12/010,190

(22) Filed: Jan. 22, 2008

(65) Prior Publication Data

US 2009/0186758 A1 Jul. 23, 2009

(51) Int. Cl.
*G03F 7/00* (2006.01)
*G03F 7/004* (2006.01)
*G03F 7/09* (2006.01)

(52) U.S. Cl. ........................ 430/270.1; 430/7; 430/915; 430/905; 430/945

(58) Field of Classification Search ............. 430/270.1, 430/527, 7, 915, 905, 945

See application file for complete search history.

(56) References Cited

U.S. PATENT DOCUMENTS

| | | | | |
|---|---|---|---|---|
| 4,307,047 | A | 12/1981 | Edinger et al. | |
| 4,578,329 | A | 3/1986 | Holsappel | |
| 4,595,647 | A | 6/1986 | Spanjer | |
| 4,816,374 | A | 3/1989 | Lecomte | |
| 5,179,065 | A * | 1/1993 | Ito | 503/202 |
| 5,489,639 | A | 2/1996 | Faber et al. | |
| 6,214,916 | B1 | 4/2001 | Mercx et al. | |
| 6,420,449 | B1 * | 7/2002 | Sagane et al. | 522/2 |
| 6,478,861 | B1 * | 11/2002 | Kwan et al. | 106/31.14 |
| 6,627,299 | B1 * | 9/2003 | Feng et al. | 428/207 |
| 6,821,305 | B2 | 11/2004 | Yan | |
| 6,924,077 | B2 | 8/2005 | Delp et al. | |
| 7,022,748 | B2 * | 4/2006 | Wilke et al. | 522/95 |
| 7,143,953 | B2 * | 12/2006 | Takahashi et al. | 235/494 |
| 7,270,865 | B2 * | 9/2007 | Gore | 428/64.4 |
| 7,314,704 | B2 * | 1/2008 | Gore | 430/337 |
| 7,544,448 | B2 * | 6/2009 | Cole et al. | 430/9 |
| 2002/0002225 | A1 | 1/2002 | Reil | |
| 2002/0122931 | A1 | 9/2002 | Brownfield et al. | |
| 2004/0138349 | A1 * | 7/2004 | Babler | 524/88 |
| 2004/0147399 | A1 * | 7/2004 | Gore | 503/221 |
| 2004/0259022 | A1 * | 12/2004 | Hiller et al. | 430/270.1 |
| 2007/0080146 | A1 * | 4/2007 | Stockum et al. | 219/121.6 |
| 2007/0092680 | A1 | 4/2007 | Chaffins et al. | |
| 2007/0092828 | A1 * | 4/2007 | Gore | 430/270.1 |
| 2007/0148393 | A1 | 6/2007 | Sellars | |
| 2007/0254997 | A1 | 11/2007 | Chung et al. | |
| 2008/0128493 | A1 * | 6/2008 | Jones et al. | 235/380 |

FOREIGN PATENT DOCUMENTS

| | | | |
|---|---|---|---|
| EP | 0 111 357 | A1 | 6/1984 |
| EP | 0 190 997 | A2 | 8/1986 |
| EP | 0 675 001 | A1 | 10/1995 |

OTHER PUBLICATIONS

T. Klip, "Laser Marking of Plastics", Annu. Tech. Conf. Soc. Plast. Eng., $49^{th}$, pp. 1901-1903 (1991).

* cited by examiner

*Primary Examiner*—Amanda C. Walke
(74) *Attorney, Agent, or Firm*—Birch, Stewart, Kolasch & Birch, LLP

(57) ABSTRACT

Record material imageable with a laser beam. The material is a substrate such as paper or polyolefin film having provided on at least one surface thereof a coating containing a solvent-soluble or disperse-type dye suitable for coloring plastics or polymers. Typical solvent-soluble and disperse-type dye include monoazo dyes, diazo dyes, anthraquinone dyes, coumarin dyes, quinoline dyes, xanthene dyes, and naphthalimide dyes. The record material does not show visible dye specks in the coating layer on the substrate because the dye has a very small average particle size—less than 50 microns. No more than 1% of the dye particles are larger than 100 microns. Also, method for imaging a substrate using heat energy by applying heat energy to the described record material to bring about a temperature in the coating greater than the melting temperature of the dye, causing color to become visible in the record material.

11 Claims, No Drawings

LASER COLORATION OF COATED SUBSTRATES

FIELD OF THE INVENTION

The present invention relates to record materials made up of substrates, such as paper or polyolefin film, having coatings thereon containing dyes which are imageable with laser beams.

BACKGROUND OF THE INVENTION

Laser beams provide a means of writing, bar coding, and decoratively marking substrates. Advantages of the use of lasers over conventional printing technologies include the ease with which layouts can be adjusted and integrated into production lines using computer graphics programs. Laser marking enables a contact-free procedure, even on soft, irregular surfaces that are not readily accessible. In addition, laser marking is ink-free, which makes it long lasting. It is also solvent-free, and thus environmentally advantageous.

Color imaging with a laser beam can be achieved through the use of leuco dyes and sensitizers or through the use of appropriate pigments. For instance, U.S. Pat. No. 4,307,047 describes the use of iron oxide hydroxide that yields a color when water of crystallization of the oxide is split off at 260° C. U.S. Pat. No. 6,214,916 describes a resin composition having laser marking properties employing a Neodymium-Doped Yttrium-Aluminum-Garnet ("NdYAG") radiation laser on a composition comprising a polyester thermoplastic resin, an amount of light pigment sufficient to form a light background coloration, and an effective amount of marking agent. The polyester thermoplastic resin decomposes in areas struck by the laser to form dark colored markings on the light background coloration. Disclosed marking agents are boron phosphate, zinc oxide, zinc stannate, zinc hydrostannate, tin (II) oxalate, and mixtures thereof.

Several laser types are available for marking surfaces. Excimer lasers with frequencies in the range 196-351 nanometers lead to the marking of surfaces by photochemical ablation or reaction. Using NdYAG lasers at lower power levels at 532 nanometers provides laser marking by leaching or selective bleaching of dyes or pigments. Using NdYAG lasers at 1064 nanometers leads to laser marking by carbonization, sublimation, discoloration, foaming, or engraving. Use of $CO_2$ lasers at 10600 nanometers enables laser marking by thermochemical reaction, melting, vaporizing, and engraving. Speeds of up to 10,000 mm/sec are possible with $CO_2$ lasers, while NdYAG lasers allow speeds of up to 2000 mm/sec.

Several materials have been found to be useful for providing contrast in laser marking. One type of laser marking provides a light contrast on a dark background. Carbon black may be used in this approach. Carbon black works by decomposing into volatile components after absorbing laser light. The volatile components foam at the surface of the substrate incorporating the carbon black, leading to light scattering and thus a light impression. EP 0 675 001 teaches that zinc borate, which releases its water of hydration, may also be used as a contrast-enhancing additive. U.S. Pat. No. 4,595,647 discloses a laser-markable material useful for encapsulation of electronic devices. In this system, $TiO_2$ or $TiO_2$ and $CrO_3$ are added to common plastic encapsulants formed from a mixture of a resin/filler/carbon black/mold release agent. When irradiated by a $CO_2$ laser, the originally grey material turns bright gold, providing a high contrast, durable mark. U.S. Pat. No. 5,063,137 teaches that anhydrous metal borate or metal phosphate salts, phosphoric acid-containing glass, basic zinc carbonate, and basic magnesium carbonate when mixed with a resin give, upon exposure to a laser, a white marking on a dark background.

A dark contrast on a light background is also possible using lasers. EP 0 111 357 and U.S. Pat. No. 4,578,329 disclose that metal silicates provide black markings on articles having a polyolefin surface. U.S. Pat. No. 5,489,639 teaches that copper phosphate, copper sulfate, and copper thiocyanate with a thermoplastic resin give dark markings upon treatment with a laser. U.S. Pat. No. 4,816,374 teaches that lead iodide, lead carbonate, lead sulfide, dioxin isocyanate, antimony, and related compounds and mixtures give dark markings upon treatment with a laser when used with polyolefin substrates.

The effects of different silicates on the laser marking of polyolefins are described in Kilp, "Laser Marking of Plastics", *Annu. Tech. Conf. Soc. Plast. Eng.,* $49^{th}$, pages 1901-1903 (1991). Kaolin gives white marks on colored substrates, while black marks are obtained when mica or titanium dioxide is incorporated into the substrate.

US 2002/0002225 describes black thermoplastic molding compositions which contain dye combinations made from non-absorbing, non-black polymer-soluble dyes that produce black thermoplastic molding compositions which are transparent or translucent to laser light. These compositions are used to laser-weld one thermoplastic resin to another. This published application focuses on anthraquinone dyes used in combination(s) to yield a black image.

Laser imaging in general is known to some degree. For instance, US 2002/0122931 is entitled "Papers and Cardboard Products Suitable for Laser Marking, Method for Producing Same and their Use for Packaging Materials, Bank Notes and Securities, Security Paper and Graphic Products." This application relies on paperboard or paper with plate-like materials. US 2007/0148393 teaches at paragraphs [0072]-[0080] the use of a varnish with oxyanion metals for purposes of laser imaging. EP 0 190 997 B1 claims a method for the inscription of high molecular weight organic material which contains a radiation-sensitive additive which effects a change in color, where the radiated energy is directed onto the surface of the high molecular weight organic material. Laser light of specified wavelengths is taught to be useful. The additive contained in the high molecular weight organic material is taught to be an inorganic pigment and/or an organic pigment and/or a polymer-soluble dye.

Coumarin-type dyes are often employed in fillers in molding materials and plastic articles. The poor solubility of such dyestuffs in water has resulted in a perception that they are unsuitable as a water-based paper coating material.

SUMMARY OF THE INVENTION

The present invention provides an alternative to carbonless or thermal-type imaging. This invention provides a coating on a paper or paper-like substrate, which coating can form a high density image when contacted with an energy source, preferably a laser. No toners, such as electrostatic melt-fused toners, are required. Only the dye, pre-coated or pre-mixed onto the sheet, is necessary for heat-based imaging in accordance with the present invention.

The present invention provides a white or substantially white coating layer on a paper substrate which—when struck with a laser beam, such as a YAG or $CO_2$ laser beam—change color in the areas of the substrate that have been struck by the laser. Single and/or multiple colors can be provided on an individual substrate, depending on the structure of the coating.

In one embodiment, the present invention provides a record material that is imageable with a laser beam. This record material is made up of a substrate, such as a paper or a similar cellulosic substrate comprising white filler or a polyolefin film, which has on at least one surface thereof a coating that contains a dye. The dye is generally a solvent-soluble or disperse-type dye suitable for coloring plastics or polymers, such as a monoazo dye, a diazo dye, an anthraquinone dye, a coumarin dye, a quinoline dye, a xanthene dye, a naphthalimide dye, or a mixture thereof. In accordance with this invention, the dye does not show visible dye specks in the coating layer, due to the dye in the coating having an average particle size of less than 50 microns and due to no more than 1% of dye particles in the coating being larger in diameter than 100 microns.

In a preferred embodiment, for instance, the dye is incorporated into the coating in the form of a dry powder having a average particle size of 20-80 μm or in the form of an aqueous-based slurry containing dye particles in that size range. The slurry can include the dye and water, along with a dispersant, at a low concentration compatible with a coating operation. The dispersant can be, for instance, an ionic or nonionic dispersants or mixtures thereof, e.g., a polyalkylene glycol ester, an acrylate, or a urethane. The slurry can further contain a thickener, such as carboxymethyl cellulose, hydroxyethyl cellulose, or an acrylate.

In accordance with this invention, the record material will typically have the dye present on the surface of the substrate at a concentration of 1% or less (dry on total solid components), so that the dye is thereby substantially colorless on the surface of the substrate.

Another embodiment of this invention is method for imaging a substrate using heat energy. One starts with a record material as described above, and one applies heat energy to the record material to effect a temperature in the coating of said record material greater than the melting temperature of the dye in said coating but lower than a temperature that would materially damage said substrate, thereby causing color to become visible in said record material. The heat energy may be applied, for instance, by focusing laser light energy though a lens at least 2.5 inches in diameter and conducting laser irradiation for a period of time sufficient to melt the dye in the coating without burning off or otherwise damaging the coating. This application of heat energy, for instance, may cause an azo dye to become visible by melting and concentrating into dispersant at areas of laser contact on a surface of said substrate, or by solubilizing and concentrating into dispersant at areas of laser contact on a surface of said substrate.

In yet another embodiment, this invention contemplates, a method for imaging a substrate using heat energy, which includes the sequential steps of: blending a mixture of laser-activatable dyestuff, water, and a surfactant to provide a dispersion of particles of said dyestuff which are less than 100 microns in diameter; adding a binder to the blended dispersion to form a coating; applying said coating to a paper substrate; positioning the coated paper in the path of a laser beam, wherein said laser beam is controllable by a computer which is programmed to project the laser beam in a predetermined pattern; and applying heat energy to said coated paper at an intensity sufficient to effect a temperature in the coating thereof greater than the melting temperature of the dye in said coating but lower than a temperature that would materially damage said paper substrate, whereby color is caused to become visible in said coated paper.

DETAILED DESCRIPTION OF THE INVENTION

The present invention provides a record material that is imageable with a laser beam. The record material is a substrate, such as paper or polyolefin film, having provided on at least one surface thereof a coating containing a solvent-soluble or disperse-type dye suitable for coloring plastics or polymers. Types of solvent-soluble and disperse-type dyes which may be used in this invention are described in detail hereinbelow. The record material does not show visible dye specks in the coating layer on the substrate because the dye has a very small average particle size—that is, the dyestuff in the coating has an average particle size of less than 50 microns. Also, at most 1% of the dye particles are larger than 100 microns. The record material is imaged using heat energy, by applying heat energy, generally by means of lasers to the record material of this invention in order to bring about a temperature in the coating greater than the melting temperature of the dye, which causes color to become visible in the record material. This aspect of the present invention is also described in greater detail hereinbelow.

Many different types of dyes may be used in implementing the present invention. For instance, one may employ red dyes such as SR 3, SR 19, SR 23, SR 24, SR 26, SR 27, SR 52, SR 161, SR 161, SR 164, and SR 195, or green dyes such as SG 3, SG 4, SG 5, and SG 7. One may employ blue dyes such as SB 14, SB 26, SB 35, SB 59, SB 79, SB 97, and SB 98, or yellow dyes such as SY 33, SY 44, SY 56, SY 94, SY 98, SY 124, SY 160:1, and SY 172. One may also employ violet dyes, black dyes, brown dyes, or dyes of any color, or a mix of dyes to attain different shades, so long as they change color when activated by a laser beam.

To amplify upon the types of dyes that can be used in the present invention, one class of such is fuel dyes of the type used to dye low-tax fuels to deter their use in applications intended for higher-taxed ones. These dyes are soluble in hydrocarbon-based nonpolar solvents, hence the name solvent soluble dyes. The red dyes are often diazo type dyes like Solvent Red 19, Solvent Red 24, and Solvent Red 26 shown below.

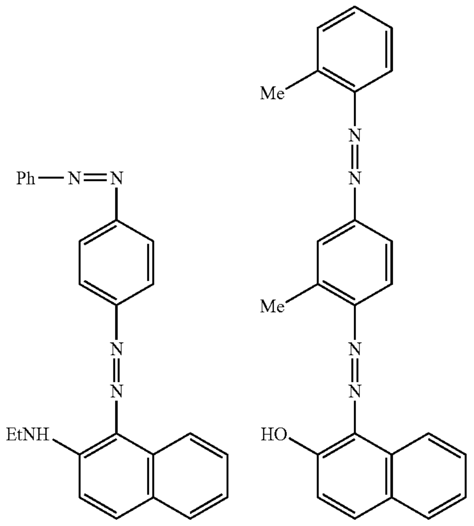

Solvent Red 19 Solvent Red 24

-continued

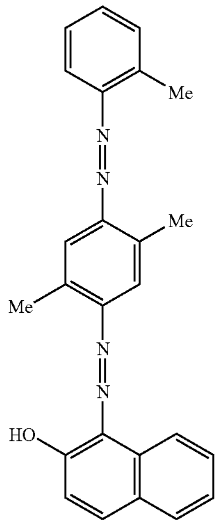

Solvent Red 26

The green and blue shades are anthraquinone-type dyes (structures shown below) and the yellows fall into a mixed category—could be monoazo (Ph-N=N-Ph) or have (O=C—C—C=O or O=C—N—C=O) as part of the structure. Some examples are shown below.

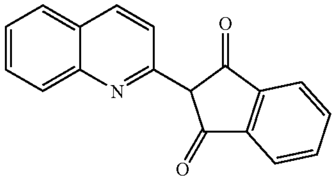

Solvent Yellow 33

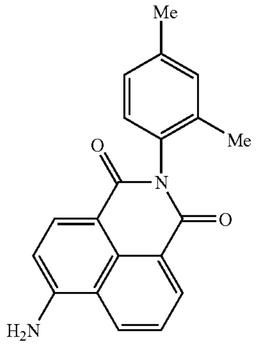

Solvent Yellow 44

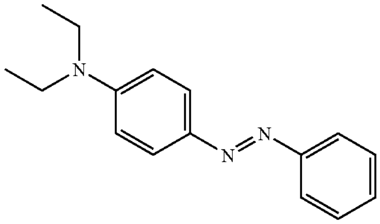

Solvent Yellow 56

-continued

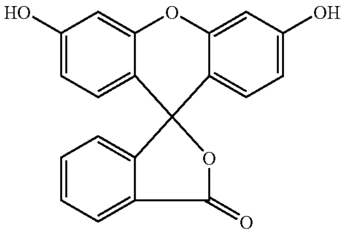

Solvent Yellow 94

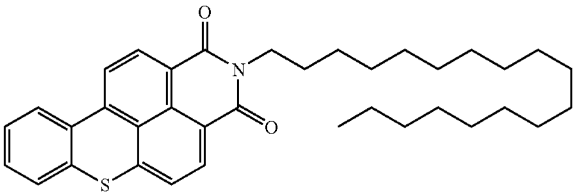

Solvent Yellow 98

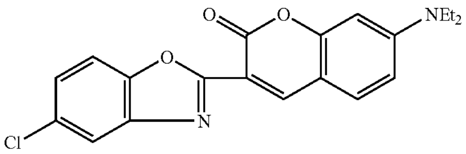

Solvent Yellow 160:1

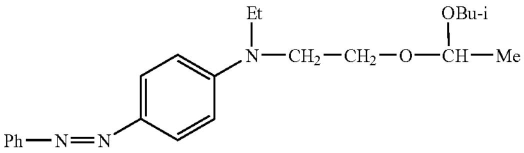

Solvent Yellow 124

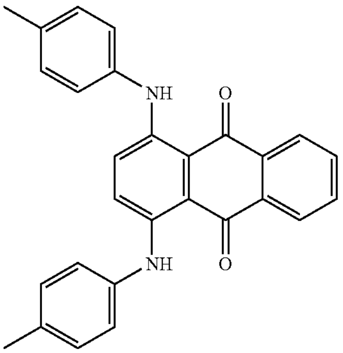

Solvent Green 3

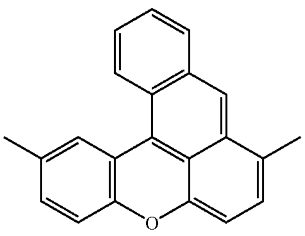

Solvent Green 4

-continued

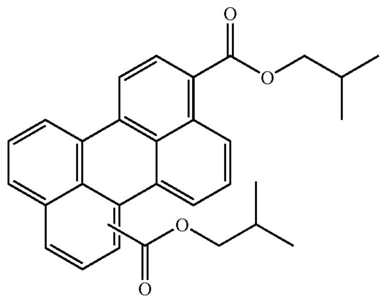

Solvent Green 5

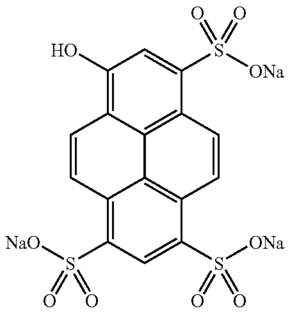

Solvent Green 7

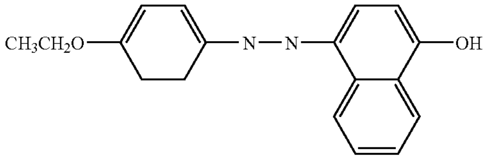

Solvent Red 3

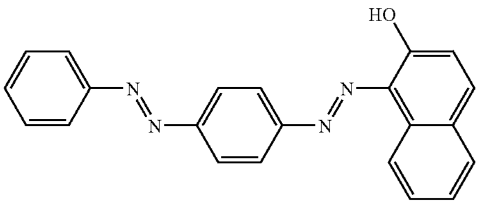

Solvent Red 23

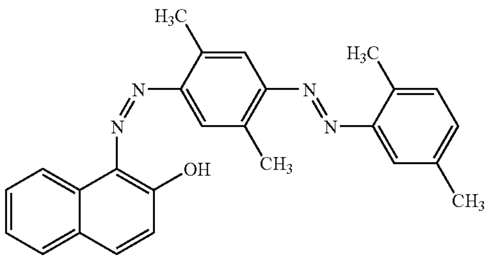

Solvent Red 27

-continued

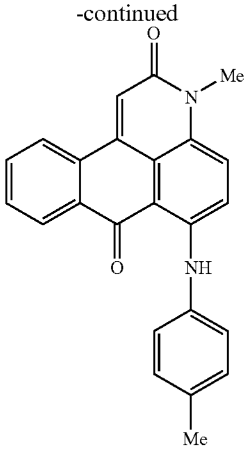

Solvent Red 52

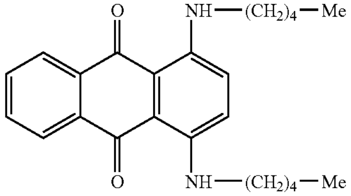

Solvent Blue 14

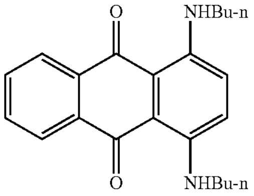

Solvent Blue 35

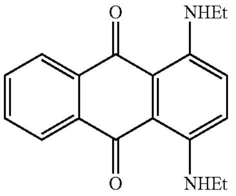

Solvent Blue 59

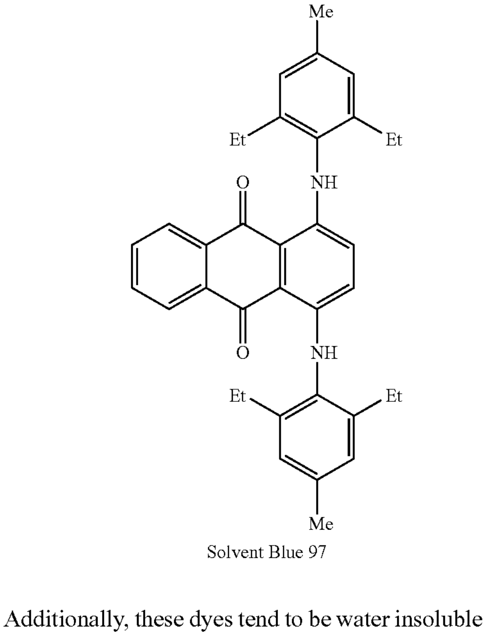

Solvent Blue 97

Additionally, these dyes tend to be water insoluble or only sparingly soluble and have melting temperatures below 310° C. They may also sublime as the temperature is increased.

In accordance with the present invention, the dyes can be incorporated into paper (raw stock) or coating systems. Aqueous based dye slurries prepared by grinding to average particle sizes of 10-100 μm and more preferably 20-80 μm work best for this invention. At particle sizes greater than 100 μm, the dye particles tend to appear as dirt in the paper or cause streaks in coated paper. For white paper, average particle sizes between 20 and 80 μm work the best so that the paper stays white. At particle sizes below 10-15 μm, the dye imparts color to the paper and the whiteness is lost. If colored paper is desired, the particle size can be reduced as much as possible. The paper would have an even color and still would respond to laser treatment with high enough contrast to show as color laser marking. The dye is typically incorporated in amounts less than 1% either in the raw stock or in the coating.

In accordance with this invention, the dyestuffs may be coated onto the substrate (e.g., paper or polyolefin) in an aqueous slurry comprising the dye, water, and a dispersant. The dispersant is present in the slurry at a low concentration compatible with a coating operation. Typically dispersants are selected from the group consisting of ionic and nonionic dispersants and mixtures thereof. Useful dispersants include polyalkylene glycol esters, acrylates, and urethanes. The slurry used to coat a dyestuff onto a substrate in accordance with the present invention may further include a thickener and/or a white filler.

One embodiment of the present invention is a method for imaging a substrate using heat energy. This method includes blending a mixture of laser-activatable dyestuff, water, and a surfactant to provide a dispersion of particles of said dyestuff which are less than 100 microns in diameter. Typical laser activatable dyestuffs are Solvent Green 5, Solvent Blue 14, Solvent Red 27, and Solvent Green 3, but of course any laser activatable dyestuff may be used. One method of providing the dispersion is to mix a small amount of the dyestuff, e.g. from 0.05 grams to 1.5 grams, with a large amount of water, e.g. from 20 to 100 grams, and a small amount of dispersant, e.g. from 0.5 grams to 5 grams, and then to blend the mixture for from 2 to 10 minutes, until the particle size of the dye component is reduced to less than 100 microns. Another approach is to mix a large relative amount of dyestuff (e.g., 55-75%) with a smaller amount of clay (e.g. 25-45%) and a very small amount of dispersant (0.1 to 1.0%), then dilute the mixture with sufficient water for flowability and run it through an attritor for sufficient time (e.g., 15-30 minutes) to reduce the particle size of the dye component to less than 100 microns. A dye slurry having a solids content of about 1-5% is made up from the small-dyestuff particle material produced by either of these methods, and then approximately 10-50% binder is added to the dyestuff vehicle. Typical binders include styrene acrylics, acrylics, polyesters, polyurethanes, starches, polyvinyl alcohols, and polyethylene glycol fatty acid esters. White pigment such as titanium dioxide may be added to the dyestuff vehicle in addition to the binder, in order to adjust the color and/or texture of the resulting coating material. The resulting coating material is applied to a substrate, typically of paper or polymer film.

To activate the color, the coated paper or polymer film is positioned in the path of a laser beam that is controllable by a computer which is programmed to project the laser beam in a predetermined pattern. Heat energy is applied to the coated substrate at an intensity sufficient to effect a temperature in the coating thereof greater than the melting temperature of the dye in said coating but lower than a temperature that would materially damage said paper substrate. Depending on the nature of the substrate and the dye to be activated, the laser intensity can range from 5-100%. A laser marking intensity of 20% is often useful in this step. This procedure causes a colored pattern to become visible in the coated paper or polymeric film.

Persons skilled in the art will realize that many different types of lasers can be used to activate the coloring material in the context of the present invention. For instance, any low power $CO_2$ laser can be used. Typical examples include Synrad's Firestar V 30, produced by Synrad, Inc., of 4600 Campus Place, Mukilteo, Wash., and Videojet's Videojet 3320, produced by Videojet Technologies Inc., of 1500 Mittel Boulevard, Wood Dale, Ill. The Firestar V 30 is a 30 watt air-cooled laser with a fast rise and fall time and near-perfect beam quality. The Videojet 3320 features a single sealed 30 watt $CO_2$ laser in which beam deflection is controlled by digital high-speed galvanometer scanners. Such lasers generate high power light via excitation of the $CO_2$ within a sealed chamber. The light is focused to a small, intense beam that is used for writing or marking. The whole process, from excitation to writing or marking, is controlled by computer software supplied with the laser system.

EXAMPLES

Example 1

Solvent Green 5 (0.70 g), water (40.20 g) and EMEREST 2660 dispersant (1.00 g), a PEG 600 monooleate from Cognis Corporation, are blended for 10 minutes in a Waring blender to break the dye down to the desired particle size of less than 100 μm. Airflex RB8 emulsion binder (9.94 g), a vinyl acetate copolymer emulsion from Air Products and Chemicals, Inc., is then added to the blend and mixed thoroughly to form the coating. The coating is applied to a paper substrate using a size 5 Meyer rod. The coated paper, which at this stage is white in color, is then mounted on a table under a $CO_2$ laser head directly in the path of the laser beam. The laser system is connected to a computer equipped with software that allows one to create any desired graphics and transfer the graphics to the substrate at the touch of a button. A laser marking intensity of 20% is employed to activate the dye. In this example, the desired graphic pattern shows on the substrate in a fluorescent yellow color.

Example 2

Solvent Blue 14 (0.07 g), water (41.4 g), titanium dioxide (3.0 g), and PEG 900 monostearate dispersant (1.4 g) are blended in a Waring blender for five minutes. An acrylic emulsion binder (95.3 g) is then added to the blend and mixed thoroughly. The final blend is applied to a paper substrate using a size 3 Meyer rod. A laser marking intensity of 35% is employed to activate the dye. The transferred graphics show on the substrate in a blue color following interaction of the coating with the laser beam.

Example 3

Solvent Red 27 (0.07 g), water (40.26 g), and starch binder (3.0 g) were blended as described in the examples above. A polyvinyl alcohol emulsion (76.7 g) is added to the mix and the final blend is used to coat a polyethylene film substrate, being applied with a size 0 Meyer rod. On treatment with a laser beam (15% intensity), the transferred graphics show up in red on the coated PE film.

Example 4

Solvent Green 3 (66%), water, a dispersant (0.5%) and clay (32.5%) are put through an attritor for 20 minutes to reduce the dye particle size to the desired range. The dye slurry is used to make up a coating containing 1.5% total solids of the dry dye, 10% of titanium dioxide (white pigment), and a polyurethane binder (20%). The coating was applied to a paper substrate using a size 5 Meyer rod, and the coated paper was subjected to laser treatment (50% intensity). The transferred graphics shows up in green on the coated substrate.

While particular embodiments of the invention have been described for purposes of illustration, it will be understood that various changes and modifications within the spirit of the present invention can be made, and the invention is not to be taken as limited except by the scope of the appended claims.

What is claimed is:

1. A record material that is imageable with a laser beam, said material comprising a cellulosic substrate comprising white filler having provided on at least one surface thereof a coating containing a solvent-soluble or disperse-type dye suitable for coloring plastics or polymers, wherein said dye does not show visible dye specks in the coating layer due to the dye in the coating having an average particle size of less than 50 microns and due to no more than 1% of dye particles in the coating being larger in diameter than 100 microns.

2. The record material of claim 1, wherein said laser beam is a beam from a $CO_2$ laser or a YAG laser.

3. The record material of claim 1, wherein said substrate is paper.

4. The record material of claim 1, wherein said solvent-soluble or disperse-type dye is selected from the group consisting of monoazo dyes, diazo dyes, anthraquinone dyes, coumarin dyes, quinoline dyes, xanthene dyes, and naphthalimide dyes.

5. A record material that is imageable with a laser beam, said material comprising a cellulosic substrate comprising white filler having provided on at least one surface thereof a coating containing a solvent-soluble or disperse-type dye suitable for coloring plastics or polymers, wherein the dye is incorporated into the coating in the form of an aqueous-based slurry containing dye particles having an average particle size of 20-80 μm, and wherein said dye does not show visible dye specks in the coating layer due to the dye in the coating having an average particle size of less than 50 microns and due to no more than 1% of dye particles in the coating being larger in diameter than 100 microns.

6. The record material of claim 5, wherein the slurry comprises the dye, water, and a dispersant, at a low concentration compatible with a coating operation, selected from the group consisting of ionic and nonionic dispersants and mixtures thereof.

7. The record material of claim 6, wherein the dispersant is a polyalkylene glycol ester, an acrylate, or a urethane.

8. The record material of claim 6, wherein the slurry further comprises a thickener.

9. The record material of claim 8, wherein the thickener is carboxymethyl cellulose, hydroxyethyl cellulose, or an acrylate.

10. The record material of claim 1, wherein the dye is present on the surface of the substrate at a dry on total solid components concentration of 1% or less, thereby being substantially colorless on the surface of the substrate.

11. The record material of claim 1, wherein the dye is incorporated into the coating in the form of a dry powder having a average particle size of 20-80 μm.

* * * * *